(12) United States Patent  
Cheah et al.

(10) Patent No.: US 8,546,849 B2
(45) Date of Patent: Oct. 1, 2013

(54) HIGH VOLTAGE CASCODED III-NITRIDE RECTIFIER PACKAGE UTILIZING CLIPS ON PACKAGE SURFACE

(75) Inventors: Chuan Cheah, Torrance, CA (US); Dae Keun Park, Irvine, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/364,242

(22) Filed: Feb. 1, 2012

(65) Prior Publication Data

US 2012/0280247 A1 Nov. 8, 2012

Related U.S. Application Data

(60) Provisional application No. 61/482,314, filed on May 4, 2011.

(51) Int. Cl.
*H01L 29/778* (2006.01)
*H01L 29/20* (2006.01)

(52) U.S. Cl.
USPC .... 257/195; 257/194; 257/696; 257/E29.089; 257/E29.249; 257/76

(58) Field of Classification Search
USPC .................... 257/76, 194, 195, 696, E29.089, 257/E29.249
See application file for complete search history.

(56) References Cited

U.S. PATENT DOCUMENTS

| | | | |
|---|---|---|---|
| 7,271,470 B1 | 9/2007 | Otremba | |
| 7,663,212 B2 * | 2/2010 | Otremba | 257/678 |
| 2003/0155644 A1 | 8/2003 | Hirao | |
| 2005/0285249 A1 | 12/2005 | Carney | |
| 2007/0063216 A1 | 3/2007 | Hu | |
| 2007/0176291 A1 * | 8/2007 | Cheah et al. | 257/744 |
| 2007/0222044 A1 * | 9/2007 | Otremba | 257/678 |
| 2008/0191216 A1 | 8/2008 | Machida | |
| 2009/0189291 A1 | 7/2009 | Landau | |
| 2010/0000772 A1 | 1/2010 | Letterman | |
| 2011/0024884 A1 | 2/2011 | Xue | |
| 2011/0101511 A1 | 5/2011 | Lu | |
| 2011/0133337 A1 | 6/2011 | Shau | |
| 2012/0223322 A1 * | 9/2012 | Lin et al. | 257/76 |
| 2012/0228696 A1 | 9/2012 | Carpenter | |
| 2012/0280245 A1 * | 11/2012 | Cheah et al. | 257/76 |
| 2012/0280246 A1 * | 11/2012 | Cheah et al. | 257/76 |

FOREIGN PATENT DOCUMENTS

| | | |
|---|---|---|
| JP | 2003-197859 | 7/2003 |
| JP | 2007-27404 | 2/2007 |

* cited by examiner

*Primary Examiner* — Victor A Mandala
(74) *Attorney, Agent, or Firm* — Farjami & Farjami LLP

(57) ABSTRACT

Some exemplary embodiments of high voltage cascoded III-nitride semiconductor package utilizing clips on a package support surface have been disclosed. One exemplary embodiment comprises a III-nitride transistor attached to a package support surface and having an anode of a diode stacked over a source of the III-nitride transistor, a first conductive clip coupled to a gate of the III-nitride transistor and the anode of the diode, and a second conductive clip coupled to a drain of the III-nitride transistor. The conductive clips are connected to the package support surface and expose respective flat portions that are surface mountable. In this manner, reduced package footprint, improved surge current capability, and higher performance may be achieved compared to conventional wire bonded packages. Furthermore, since a low cost printed circuit board (PCB) may be utilized for the package support surface, expensive leadless fabrication processes may be avoided for cost effective manufacturing.

11 Claims, 4 Drawing Sheets

US 8,546,849 B2

HIGH VOLTAGE CASCODED III-NITRIDE RECTIFIER PACKAGE UTILIZING CLIPS ON PACKAGE SURFACE

The present application claims the benefit of and priority to a pending provisional application entitled "High Voltage Cascaded GaN Rectifier Leadless Packages," Ser. No. 61/482,314 filed on May 4, 2011. The disclosure in that pending provisional application is hereby incorporated fully by reference into the present application.

BACKGROUND OF THE INVENTION

1. Field of the Invention

The present invention relates generally to semiconductor devices. More particularly, the present invention relates to packaging of semiconductor devices.

2. Background Art

For high power and high performance circuit applications, III-nitride transistors such as gallium nitride (GaN) field effect transistors (FETs) are often desirable for their high efficiency and high voltage operation. In particular, it is often desirable to combine such III-nitride transistors with other devices, such as silicon diodes, to create high performance rectifiers such as cascoded rectifiers.

Unfortunately, conventional package integration techniques for combining III-nitride transistors with silicon diodes often negate the benefits provided by such III-nitride transistors. For example, conventional package designs may require wire bonds to leads for terminal connections, undesirably increasing package form factor, manufacturing costs, parasitic inductance, resistance, and thermal dissipation requirements of the package. While quad flat no leads (QFN) packages are known to avoid wire bonds, such packages may undesirably require high cost fabrication facilities.

Thus, a unique cost-effective solution is needed to support the cost effective fabrication of packages integrating high voltage cascoded III-nitride rectifiers.

SUMMARY OF THE INVENTION

A high voltage cascoded III-nitride rectifier package utilizing clips on a package support surface, substantially as shown in and/or described in connection with at least one of the figures, and as set forth more completely in the claims.

DETAILED DESCRIPTION OF THE INVENTION

Figure 1:
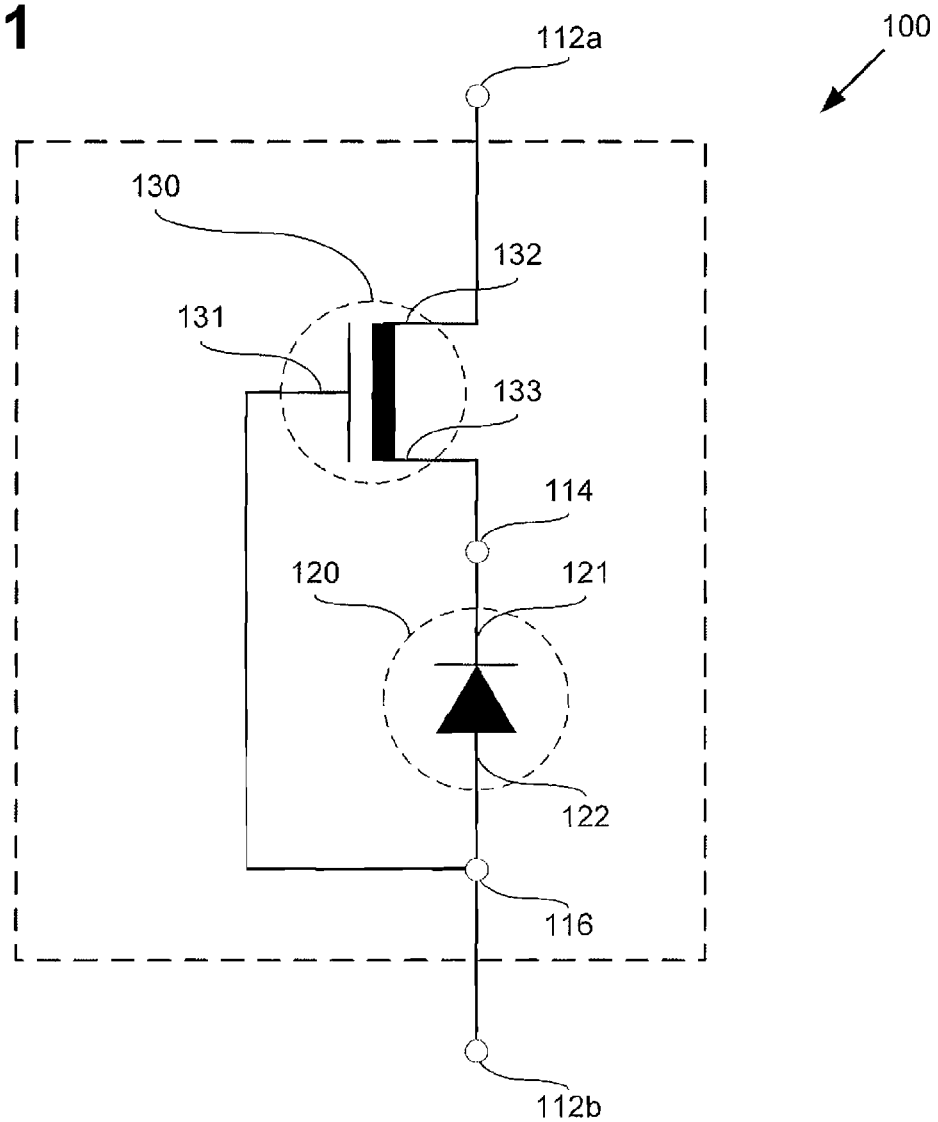
FIG. 1 illustrates a circuit diagram of a III-nitride transistor coupled with a Group IV diode.

The present application is directed to a high voltage cascoded III-nitride rectifier package utilizing clips on a package support surface. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

As used herein, the phrase "III-Nitride or III-N" refers to a compound semiconductor that includes nitrogen and at least one group three element including Al, Ga, In and B, and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAsPbN_{(1-a-b)}$), aluminum indium gallium arsenide phosphide nitride ($Al_xIn_yGa_{(1-x-y)}AsPbN_{(1-a-b)}$), amongst others. III-nitride material also refers generally to any polarity including but not limited to Ga-polar, N-polar, semi-polar or non-polar crystal orientations. The III-Nitride material also includes either the Wurtzitic, Zincblende or mixed polytypes, and includes single-crystal, monocrystal, polycrystal or amorphous crystal structures.

Also as used herein, the phrase "Group IV" refers to a semiconductor that includes at least one group four element including Si, Ge and C, and also includes compound semiconductors SiGe and SiC amongst others. Group IV also refers to semiconductor material which consists of layers of Group IV elements or doping of group IV elements to produce strained silicon or strained Group IV material, and also includes Group IV based composite substrates including SOI, SIMOX and SOS (silicon on sapphire), amongst others.

U.S. patent application titled "III-Nitride Transistor Stacked with Diode in a Package," Ser. No. 13/053,646 filed on Mar. 22, 2011, whose disclosure is hereby incorporated fully by reference into the present application, teaches a two-terminal stacked-die package including a diode, such as a silicon diode, stacked atop a III-nitride transistor, such that a cathode of the diode resides on and is electrically coupled to a source of the III-nitride transistor. A first terminal of the package is coupled to a drain of the III-nitride transistor, and a second terminal of the package is coupled to an anode of the diode.

The present application addresses and discloses modifications needed to form a wire-bondless surface mountable high voltage semiconductor package for use in high voltage (200V-1200V or higher) applications. Additionally, the present application addresses and discloses the construction of such a package by describing the use of surface mountable conductive clips attached to a package support surface.

The present application describes the physical arrangement of a stacked-die wire-bondless surface mountable high voltage package. In particular, a Group IV diode is stacked atop a III-N material transistor in a quad flat no-lead (QFN) package. Modifications required to accommodate the high voltage field differential between the anode and cathode of the device (>200V) include widening the physical separation between the anode and cathode to, for example, 2.7500 mm or greater.

FIG. 1 illustrates a circuit diagram of a III-nitride transistor coupled with a Group IV diode, such as a silicon diode. In the present application, references to a "silicon diode" are made for brevity and convenience only. However, the "Group IV or silicon diode" in the context of the present invention's stacked-die package can be replaced with a non-silicon diode or in general with any diode. FIG. 1 includes terminals 112a and 112b, nodes 114 and 116, diode 120, and III-nitride transistor 130. III-nitride transistor 130 may, for example, comprise a gallium nitride (GaN) field effect transistor (FET), or a GaN high electron mobility transistor (HEMT), and may more specifically comprise a depletion-mode GaN transistor. Diode 120 can be either a PN junction diode or a Schottky diode.

In the example shown in FIG. 1, the cathode 121 of diode 120 is coupled to the source 133 of III-nitride transistor 130 at node 114. Additionally, a complete cascoded switch is formed by coupling the gate 131 of III-nitride transistor 130 to the anode 122 of diode 120 at node 116. Thus, the circuit of FIG. 1 implements a high performance cascoded rectifier. However, in alternative embodiments, the circuit may comprise a different configuration of diode 120 with III-nitride transistor 130.

It may be preferable to form the III-Nitride FET or III-Nitride HEMT as discussed in U.S. Pat. No. 7,745,849 issued on Jun. 29, 2010 titled "Enhancement Mode III-Nitride Semiconductor Device with Reduced Electric Field Between the Gate and the Drain," U.S. Pat. No. 7,759,699 issued on Jul. 20, 2010 titled "III-Nitride Enhancement Mode Devices," U.S. Pat. No. 7,382,001 issued on Jun. 3, 2008 titled "Enhancement Mode III-Nitride FET," U.S. Pat. No. 7,112,830 issued on Sep. 26, 2006 titled "Super Lattice Modification of Overlying Transistor," U.S. Pat. No. 7,456,442 issued on Nov. 25, 2008 titled "Super Lattice Modification of Overlying Transistor," U.S. Pat. No. 7,339,205 issued on Mar. 4, 2008 titled "Gallium Nitride Materials and Methods Associated with the Same," U.S. Pat. No. 6,849,882 issued on Feb. 1, 2005 titled "Group-III Nitride Based High Electron Mobility Transistor (HEMT) with Barrier/Spacer Layer," U.S. Pat. No. 6,617,060 issued on Sep. 9, 2003 titled "Gallium Nitride Materials and Methods," U.S. Pat. No. 6,649,287 issued on Nov. 18, 2003 titled "Gallium Nitride Materials and Methods," U.S. Pat. No. 5,192,987 issued on Mar. 9, 1993 titled "High Electron Mobility Transistor with GAN/ALXGA1-XN Heterojunctions," and U.S. patent application titled "Group III-V Semiconductor Device with Strain-Relieving Interlayers," Ser. No. 12/587,964 filed on Oct. 14, 2009, U.S. patent application titled "Stress Modulated Group Semiconductor Device and Related Method," Ser. No. 12/928,946 filed on Dec. 21, 2010, U.S. patent application titled "Process for Manufacture of Super Lattice Using Alternating High and Low Temperature Layers to Block Parasitic Current Path," Ser. No. 11/531,508 filed on Sep. 13, 2006, U.S. patent application titled "Programmable III-Nitride Transistor with Aluminum-Doped Gate," Ser. No. 13/021,437 filed on Feb. 4, 2011, U.S. patent application titled "Enhancement Mode III-Nitride Transistors with Single Gate Dielectric Structure," Ser. No. 13/017,970 filed on Jan. 31, 2011, U.S. patent application titled "Gated AlGaN/GaN Heterojunction Schottky Device," Ser. No. 12/653,097 filed on Dec. 7, 2009, U.S. patent application titled "Enhancement Mode III-Nitride Device with Floating Gate and Process for Its Manufacture," Ser. No. 12/195,801 filed on Aug. 21, 2008, U.S. patent application titled "III-Nitride Semiconductor Device with Reduced Electric Field Between Gate and Drain and Process for Its Manufacture," Ser. No. 12/211,120 filed on Sep. 16, 2008, U.S. patent application titled "III-Nitride Power Semiconductor Device Having a Programmable Gate," Ser. No. 11/857,113 filed on Sep. 8, 2007, U.S. provisional patent application titled "III-Nitride Heterojunction Devices, HEMTs and Related Device Structures," Ser. No. 61/447,479 filed on Feb. 28, 2011, and U.S. provisional patent application titled "III-Nitride Material Interlayer Structures," Ser. No. 61/449,046 filed on Mar. 3, 2011, which are all hereby incorporated fully into the present application by reference. It may also be desirable that the III-Nitride FET be a high voltage III-N FET. III-N FET 130 may be optimized to operate with a $V_{drain}$ of between 200V-5000V, or it may be preferred that FET 130 be optimized to operate between 500V-700V or any other sub range between 200V-5000V.

Figure 2A:
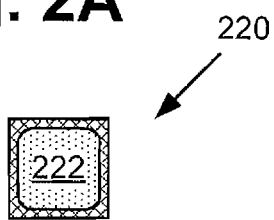
FIG. 2A illustrates a front side of a group IV diode.
Figure 2B:
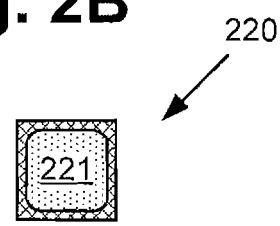
FIG. 2B illustrates a backside of a group IV diode.
Figure 2C:
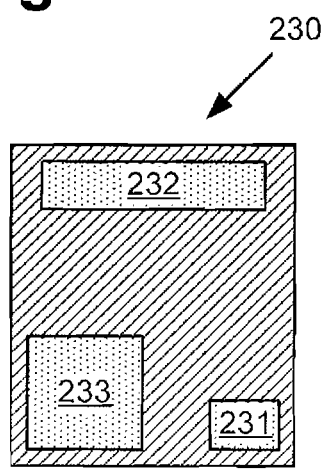
FIG. 2C illustrates a front side of a III-nitride transistor.
Figure 2D:
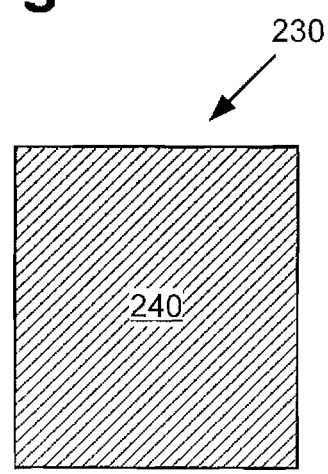
FIG. 2D illustrates a backside of a III-nitride transistor.

Turning to FIGS. 2A-2D, FIG. 2A illustrates a front side of a group IV diode, FIG. 2B illustrates a backside of a group IV diode, FIG. 2C illustrates a front side of a III-nitride transistor, and FIG. 2D illustrates a backside of a III-nitride transistor. With respect to FIGS. 2A-2D, diode 220 may correspond to diode 120 from FIG. 1, and III-nitride transistor 230 may correspond to III-nitride transistor 130 from FIG. 1. In certain embodiments, a die size of approximately 1 mm×1 mm may be preferred for diode 220. In certain other embodiments, the die size of diode 220 may be larger or smaller. As shown in FIGS. 2A and 2B, the silicon diode 220 includes an anode 222 on a top surface and a cathode 212 on an opposite bottom surface. As shown in FIGS. 2C and 2D, the III-nitride transistor 230 includes a gate 231, a drain 232, and a source 233 on a top surface, whereas a bottom or backside surface is inactive. In certain embodiments, a die size of approximately 3.2 mm×2.795 mm may be preferred for III-nitride transistor 230. In certain other embodiments, the die size of III-nitride transistor 230 may be larger or smaller.

Figure 2E:
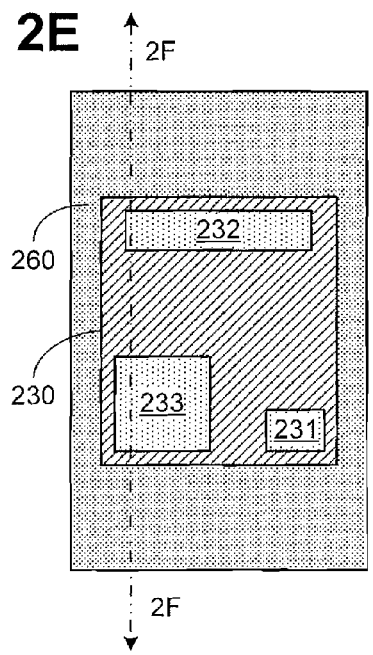
FIG. 2E illustrates a top view of a high voltage cascoded III-nitride rectifier package assembly, according to an embodiment of the invention.
Figure 2F:
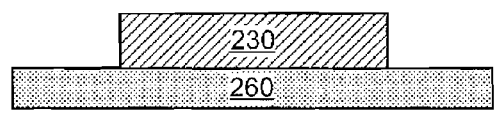
FIG. 2F illustrates a cross sectional view of a high voltage cascaded III-nitride rectifier package assembly, according to an embodiment of the invention.
Figure 2G:
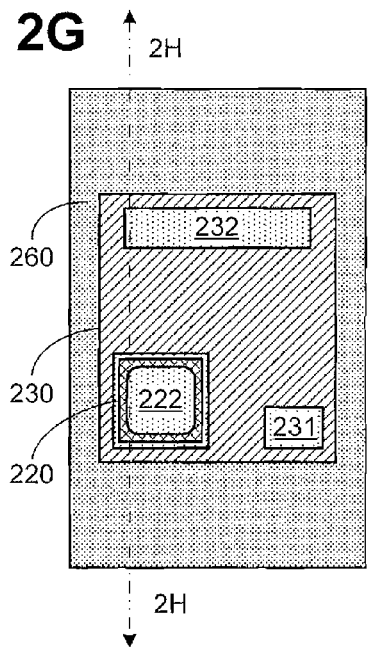
FIG. 2G illustrates a top view of a high voltage cascoded III-nitride rectifier package assembly, according to an embodiment of the invention.
Figure 2H:
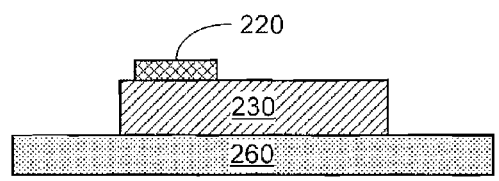
FIG. 2H illustrates a cross sectional view of a high voltage cascoded III-nitride rectifier package assembly, according to an embodiment of the invention.
Figure 2I:
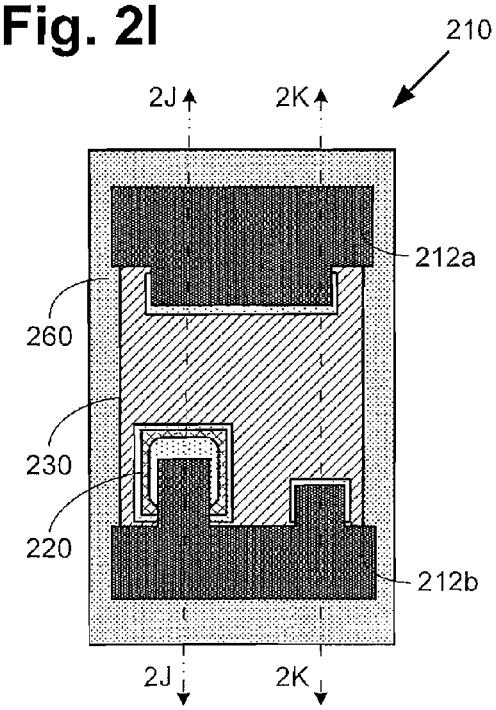
FIG. 2I illustrates a top view of a high voltage cascoded III-nitride rectifier package assembly, according to an embodiment of the invention.
Figure 2J:
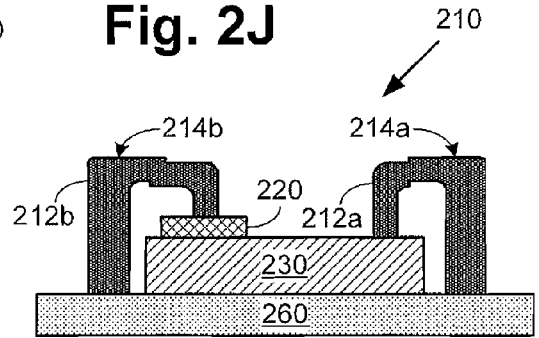
FIG. 2J illustrates a cross sectional view of a high voltage cascaded III-nitride rectifier package assembly, according to an embodiment of the invention.
Figure 2K:
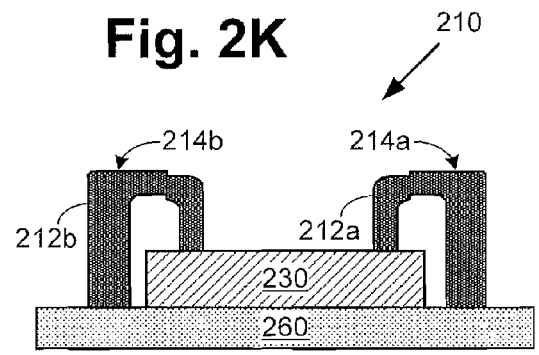
FIG. 2K illustrates a cross sectional view of a high voltage cascaded III-nitride rectifier package assembly, according to an embodiment of the invention.
Figure 3:
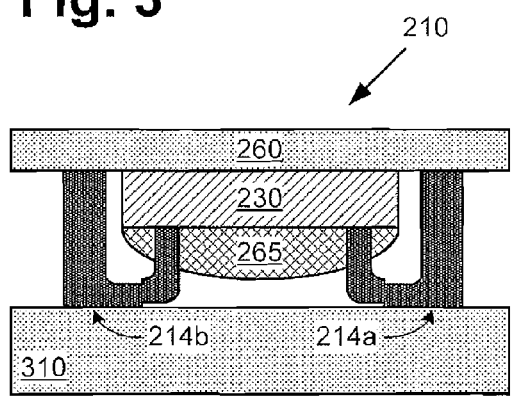
FIG. 3 illustrates a cross sectional view of a high voltage cascoded III-nitride rectifier package mounted to a system printed circuit board (PCB), according to an embodiment of the invention.

Next, FIGS. 2E, 2G, and 2I illustrate top views of a high voltage cascoded III-nitride rectifier package assembly, according to an embodiment of the invention. FIGS. 2F, 2H, 2J, 2K, and 2L also illustrate corresponding cross sectional views of a high voltage cascoded III-nitride rectifier package assembly, according to an embodiment of the invention. FIG. 3 also illustrates a cross sectional view of a completed high voltage cascoded III-nitride rectifier package mounted to a system printed circuit board (PCB), according to an embodiment of the invention.

Starting with FIG. 2E, the III-nitride transistor 230 of FIGS. 2C-2D is attached to package support surface 260, for example by a die attach material. Package support surface 260 may comprise, for example, a single, dual, or multi layer printed circuit board (PCB). However, alternative embodiments may utilize other support surfaces, such as a ceramic substrate. Package support surface 260 may be approximately 125 microns thick, but any thickness may be selected to provide appropriate stiffness for conductive clips to be connected during assembly. In certain embodiments, package support surface 260 may also include thermal traces for improved heat dissipation. As shown in FIG. 2E, the backside 240 of III-nitride transistor 230 is coupled to package support surface 260 such that gate 231, drain 232, and source 233 are accessible on a top surface. FIG. 2F also illustrates a cross sectional view corresponding to line 2F-2F in FIG. 2E.

For simplicity, the Figures may only illustrate the assembly of a single package. However, it is understood that package support surface 260 may accommodate multiple packages, for example in a strip or grid, which are later singulated into individual packages. Thus, multiple packages may be processed at the same time.

From FIG. 2E to FIG. 2G, diode 220 is stacked atop III-nitride transistor 230 such that the cathode 221 (not visible) resides on source 233. As a result, the anode 222 is accessible on a top surface of diode 220. Prior to such stacking, solder, such as a solder paste or a solder pre-form, may be applied to gate 231, drain 232, and source 233. Alternatively, other materials such as conductive adhesive or conductive tape may substitute for solder. FIG. 2H also illustrates a cross sectional view corresponding to line 2H-2H in FIG. 2G.

From FIG. 2G to FIG. 2I, conductive clips 212a and 212b may be picked and placed on top of package 210, as shown. Thus, a first conductive clip 212b is connected to anode 222 of diode 220 and gate 231 of III-nitride transistor 230, and a second conductive clip 212a is connected to drain 232 of III-nitride transistor 230. Conductive clips 212a and 212b may comprise, for example, copper or copper alloys. Prior to such placing, additional solder may be deposited on top of anode 222 of diode 220 and on top of package support surface 260. As shown in FIGS. 2J and 2K, conductive clips 212a and 212b are further connected to package support surface 260 for mechanical support. Further, conductive clips 212a and 212b each have a respective flat portion 214a and 214b, suitable for surface mounting. The flat portions 214a and 214b may also be substantially coplanar to further facilitate surface mounting of package 210.

The ends of conductive clips 212a and 212b connect to mating surfaces using straight connections, as shown in FIGS. 2J and 2K. For example, conductive clip 212b is connected to anode 222 of diode 220 by a straight connection, as shown in FIG. 2J. However, alternative embodiments may use various other connections including a screw-head, a nail-head, a mushroom connector, or a coin connector, depending on application requirements for mating surface area, mechanical stability, and ease of manufacture.

After picking and placing conductive clips 212a and 212b, the entire assembly may be heated, for example in a reflow or conveyor oven, to reflow the previously deposited solder. As a result, cathode 221 of diode 220 may be electrically and mechanically coupled to source 233 of III-nitride transistor 230, conductive clip 212b may be connected to gate 231 of III-nitride transistor 230 and anode 222 of diode 220, and conductive clip 212a may be connected to drain 232 of III-nitride transistor 230. Further, conductive clips 212a and 212b may each be connected to package support surface 260, which provides mechanical support and thermal dissipation for package 210. Thus, the cascoded rectifier circuit illustrated in diagram 100 of FIG. 1 is provided, with conductive clip 212a corresponding to terminal 112a of FIG. 1 and conductive clip 212b corresponding to terminal 112b of FIG. 1.

Figure 2L:
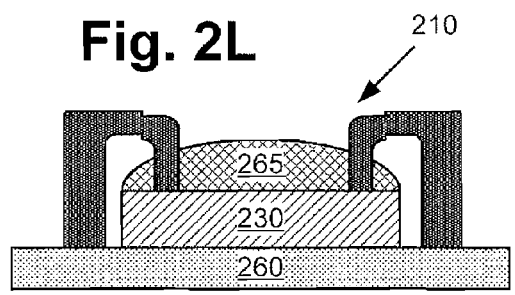
FIG. 2L illustrates a cross sectional view of a high voltage cascaded III-nitride rectifier package assembly, according to an embodiment of the invention.

From FIG. 2K to FIG. 2L, an encapsulant such as glob-top 265 may optionally be applied to package 210, providing insulation and protection for III-nitride transistor 230 and diode 220. In certain other embodiments, other encapsulants may be preferred, and the encapsulant may extend beyond the top edges of the stacked die assembly of III-nitride transistor 230 and diode 220.

From FIG. 2L to FIG. 3, package 210 may be singulated and flipped onto system printed circuit board (PCB) 310, using conventional methods as known in the art. A distance of at least 2.7500 mm, for example 3.0000 mm, may be provided between flat portions 214a and 214b mounted on system PCB 310, enabling high voltage operation at 600V. It should be noted that only a portion of system PCB 310 is shown for simplicity, as package 210 may be integrated as part of a larger circuit on system PCB 310.

Thus, a high voltage cascoded III-nitride rectifier package utilizing clips on a package support surface and methods for fabricating such a package have been described. The disclosed package provides a high voltage III-nitride cascoded rectifier in a compact package without using wire bonds. As a result, reduced package footprint, improved surge current capability, and higher performance may be achieved compared to conventional wire bonded packages. Since the package may utilize low cost package support surfaces such as single layer PCBs, expensive leadless package fabrication processes may be advantageously avoided, and available surface mount technology (SMT) manufacturing facilities may be utilized. Furthermore, since multiple packages may be assembled at a time, high integration and cost savings may be achieved compared to conventional methods requiring individual package processing.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A wire-bondless surface mountable high voltage semiconductor package comprising:
   a package support surface;
   a III-nitride transistor having a gate, a source, and a drain, said III-nitride transistor attached to said package support surface;
   a diode having an anode and a cathode, said diode stacked over said III-nitride transistor such that said cathode is mechanically and electrically coupled to said source;
   a first conductive clip connected to said gate of said III-nitride transistor, said anode of said diode, and said package support surface;
   a second conductive clip connected to said drain of said III-nitride transistor, and said package support surface;
   said first conductive clip and second conductive clip each having respective flat portions for surface mounting said high voltage semiconductor package.

2. The high voltage semiconductor package of claim 1, wherein said respective flat portions are substantially coplanar.

3. The high voltage semiconductor package of claim 1, further comprising a glob-top encapsulating said III-nitride transistor and said diode.

4. The high voltage semiconductor package of claim 3, wherein said glob-top extends beyond top edges of said III-nitride transistor.

5. The high voltage semiconductor package of claim 1, wherein said first conductive clip is connected to said anode by a connector selected from the group consisting of a coin connector, a mushroom connector, a nail-head, a screw-head, and a straight connector.

6. The high voltage semiconductor package of claim 1, wherein said first and second conductive clips comprise copper.

7. The high voltage semiconductor package of claim 1, wherein said package support surface comprises a printed circuit board (PCB).

8. The high voltage semiconductor package of claim 1, wherein said package support surface includes thermal traces.

9. The high voltage semiconductor package of claim 1, wherein said diode is a Schottky diode.

10. The high voltage semiconductor package of claim 1, wherein said III-nitride transistor is a GaN FET.

11. The high voltage semiconductor package of claim 1, wherein said III-nitride transistor is a GaN HEMT.

* * * * *

UNITED STATES PATENT AND TRADEMARK OFFICE
CERTIFICATE OF CORRECTION

| | | |
|---|---|---|
| PATENT NO. | : 8,546,849 B2 | Page 1 of 1 |
| APPLICATION NO. | : 13/364242 | |
| DATED | : October 1, 2013 | |
| INVENTOR(S) | : Cheah et al. | |

It is certified that error appears in the above-identified patent and that said Letters Patent is hereby corrected as shown below:

On the Title page, Item [54] and in the Specification, Col. 1, line 1,

In the title please insert --Support-- between Package and Surface

Signed and Sealed this
Twenty-sixth Day of November, 2013

Margaret A. Focarino
*Commissioner for Patents of the United States Patent and Trademark Office*